(12) United States Patent
Heim et al.

(10) Patent No.: US 7,648,763 B2
(45) Date of Patent: Jan. 19, 2010

(54) SECURITY ELEMENT AND METHOD FOR PRODUCTION THEREOF

(75) Inventors: Manfred Heim, Munich (DE); Theo Burchard, Gmund (DE)

(73) Assignee: Giesecke & Devrient GmbH, Munich (DE)

( * ) Notice: Subject to any disclaimer, the term of this patent is extended or adjusted under 35 U.S.C. 154(b) by 364 days.

(21) Appl. No.: 10/509,178

(22) PCT Filed: Mar. 26, 2003

(86) PCT No.: PCT/EP03/03147

§ 371 (c)(1),
(2), (4) Date: Sep. 27, 2004

(87) PCT Pub. No.: WO03/083159

PCT Pub. Date: Oct. 9, 2003

(65) Prior Publication Data

US 2005/0179254 A1    Aug. 18, 2005

(30) Foreign Application Priority Data

Mar. 28, 2002  (DE) .............................. 102 14 330

(51) Int. Cl.
  *B32B 5/16* (2006.01)
(52) U.S. Cl. .................. 428/328; 428/213; 428/689; 428/916; 427/7; 427/8; 427/10; 427/585; 427/593; 427/596; 427/248.1; 427/250

(58) Field of Classification Search .............. 427/248.1, 427/7, 8, 10, 585, 593, 596, 250; 428/328, 428/213, 689, 916
See application file for complete search history.

(56) References Cited

U.S. PATENT DOCUMENTS

| 4,393,120 | A | 7/1983 | Watai et al. |
| 4,791,017 | A | 12/1988 | Hofmann et al. |
| 5,409,782 | A | 4/1995 | Murayama |
| 6,146,773 | A | 11/2000 | Kaule |
| 6,202,591 | B1 * | 3/2001 | Witzman et al. ...... 118/723 VE |

FOREIGN PATENT DOCUMENTS

| EP | 0 727 506 A1 | 8/1996 |
| EP | 0 825 297 A1 | 2/1998 |
| GB | 2 138 027 A | 10/1984 |
| JP | 03 056662 | 3/1991 |

* cited by examiner

*Primary Examiner*—Betelhem Shewareged
(74) *Attorney, Agent, or Firm*—Rothwell, Figg, Ernst & Manbeck, P.C.

(57) ABSTRACT

The invention relates to an object, in particular a security element for security papers, bank notes, identity card or the like, as well as a security paper and a document of value with such a security element. Furthermore, the invention relates to a method for producing the object, in particular the security element or the security paper and the document of value with such a security element. The method in particular serves for manufacturing a precious-metal-coloured, preferably gold-coloured coating on a substrate.

36 Claims, 2 Drawing Sheets

SECURITY ELEMENT AND METHOD FOR PRODUCTION THEREOF

This application is a National Phase of International Application Serial No. PCT/EP03/03147, filed Mar. 26, 2003.

FIELD OF THE INVENTION

The invention relates to an object, in particular a security element for security papers, bank notes, identity card or the like, as well as a security paper and a document of value with such a security element. Furthermore, the invention relates to a method for producing the object, in particular the security element or the security paper and the document of value with such a security element. The method in particular serves for manufacturing a precious-metal-coloured, preferably gold-coloured coating on a substrate.

BACKGROUND OF THE INVENTION

When producing documents of value, which within the framework of the present invention means bank notes, check forms, shares, identification documents, credit cards, flight tickets and other deeds and documents as well as labels, seals, packaging and other elements for protecting products, it is particularly important to make arrangements against tampering and/or to take measures that permit the detection of the authenticity. Apart from the features which can be detected or used when testing is made by machines, there also exist features, which can be applied to such documents by everybody without technical auxiliary means and without any particular specialist knowledge for an unambiguous detection of the authenticity.

One possibility to equip a security element, such as a security thread, with visually easily recognizable elements is described in EP 0 330 733 B1, in which a security thread is provided with gaps in an opaque layer, and which contains colouring and/or luminescent substances in the gaps. This security thread is embedded in security papers as a so called "window security thread", i.e. it is woven in the paper during the sheet formation of the security paper, so that in regular distances it is freely accessible at the surface of the paper and fully embedded only in the intermediate areas.

So as to increase the optical strikingness of a security element and to emphasize the value of the object to be protected, the security elements often are equipped with silver or gold colour tones.

One possibility to obtain a gold-coloured coating is to vapor-deposit thin gold layers onto well reflecting grounds, such as e.g. aluminum or silver. But due to the high costs of the source material and the great technical efforts required to manufacture very regular layers, profitability is not given.

Alternatively, also gold bronzes have been applied by means of vapor deposition with evaporation boat or sputtering. When vapor-depositing with evaporation boat a wire is continuously fed into a hot boat. When the boat is hot enough the just fed piece of wire immediately evaporizes and completely transitions into the vapor phase. A substrate located thereabove is coated with just that composition of this piece of wire. Within the boats, however, little lakes are often formed out of the molten wire, which e.g. consists of a certain alloy. From these lakes the individual components of the alloy evaporate at different rates due to different vapor pressures, the proportion of ingredients therefore being changed in the deposited material and thus on the substrate. The initially set colour tone thus continuously changes across the coating length and width of the item to be vapor-deposited during the vapor deposition process.

Furthermore, also the sputtering technique is used. Here metal clusters are knocked off from a fixed target in the plasma, which condense on the substrate disposed thereabove. The composition of the coating can be kept relatively constantly, but sputtering is a very time intensive technique and thus of very low productivity.

SUMMARY OF THE INVENTION

The invention is therefore based on the problem of providing a method for producing precious-metal coloured coatings, as well as objects coated by means of such a method, in particular security elements and documents of value with such security elements. The method shall produce a constant colour tone of the coating, in particular in a profitable manner. The coated objects shall have, compared to prior art, an increased forgery-proofness, e.g. due to their optically striking appearance.

According to the invention by means of an electron beam or a resistance-heated crucible, while generating a multicomponent vapor, evaporating material is evaporated, which produces a precious-metal-coloured multicomponent coating on a substrate. Electron-beam vapor deposition or vapor deposition by means of resistance-heated crucible are vacuum coating methods, with the help of which very thin, regular coatings can be applied. With electron-beam vapor deposition evaporating material located in a crucible is heated by means of an electron beam. With that vapor is generated, which condensates on the substrate guided thereabove. Instead of via the electron beam the evaporating material can also be supplied with energy via resistance heating of the crucible. The evaporating material can be liquid, as e.g. a molten metal, and is located in a crucible. Also subliming materials can be evaporated. The evaporation can take place out of a crucible, the evaporating material in this case being e.g. a multicomponent system such as an alloy. Or the evaporating material can consist of single components, which are located in separate crucibles. Each crucible is heated by one or several electron beams or by resistance heating. The crucibles are disposed in such a way, that the vapor lobes overlap each other above the crucibles. The heating power of the individual crucibles here is adjusted in such a way that a multicomponent coating, e.g. an alloy of the desired composition, is deposited on the substrate.

BRIEF DESCRIPTION OF THE DRAWINGS

The following figures are schematic diagrams and do not necessarily correspond to the dimensions and proportions present in reality.

FIG. 1 shows an inventive document of value in a top view. The shown example is a bank note 1. This bank note has a strip-shaped security element 2, which extends across the whole width of the bank note 1. The whole surface of the security element 2 facing the viewer appears gold-coloured.

Figure 1:
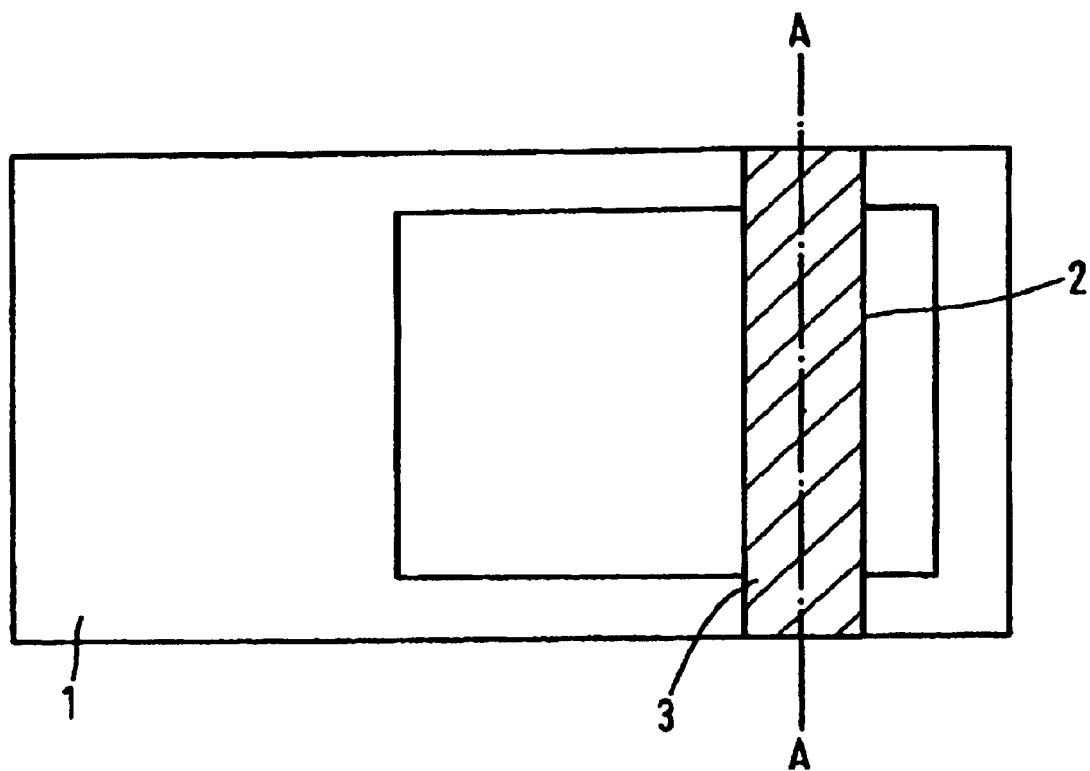
FIG. 1 shows an inventive document of value.

The security element shown in FIG. 1 is a diffractive security element, which consists of an embossed plastic layer and at least one gold-coloured layer 3 produced according to example 1.

Figure 2:
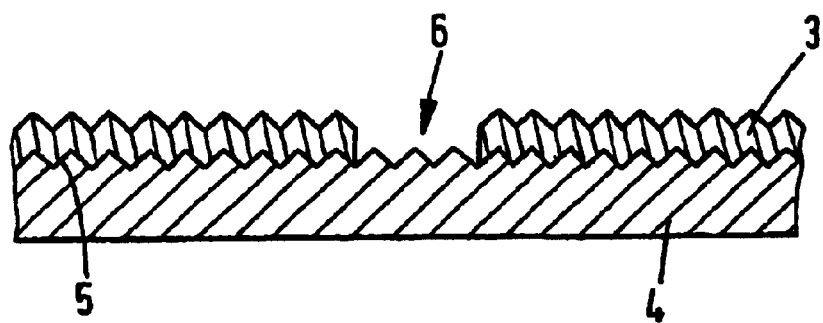
FIG. 2 shows a cross section of the inventive document of value along the line A-A and FIG. 3a, 3b show a schematic structure of a vapor deposition apparatus.

FIG. 2 shows a cross section along the line A-A in FIG. 1. Here the plastic layer 4 can be seen, where the diffraction structure is placed in. Thereabove and directly adjoining the inventive gold-coloured coating 3 is disposed, into which a gap 6 is worked. The gaps can be any characters, alphanumeric characters, patterns, logos or the like.

The security element shown in FIG. 2 can be for example a security thread. The security thread preferably consists of a transparent carrier film 4, on which the gold-coloured coating 3 is disposed.

Figure 3A:
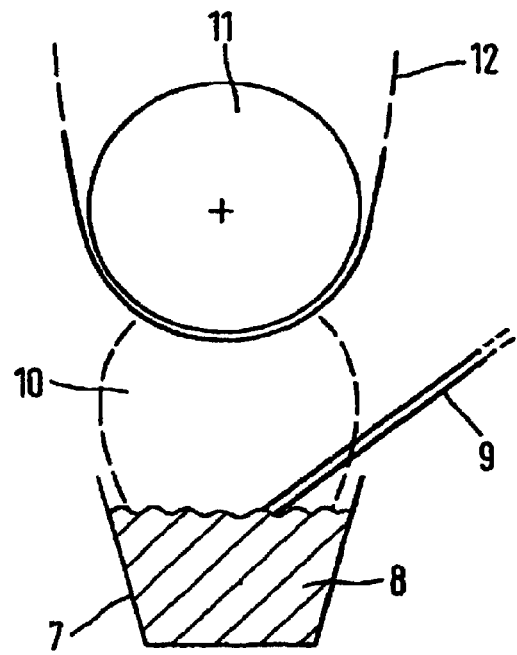

FIG. 3a schematically shows an experimental set-up, where in crucible 7 is contained a Cu/Al-alloy 8. By means of an electron beam 9 the alloy is caused to melt and while supplied with further energy to evaporate. Above the crucible a vapor lobe 10 is formed having a certain Cu/Al-composition. In this vapor lobe 10 is placed a film 12 guided on a chill roll 11, and on the film 12 a Cu/Al-alloy of the desired composition is deposited.

Figure 3B:
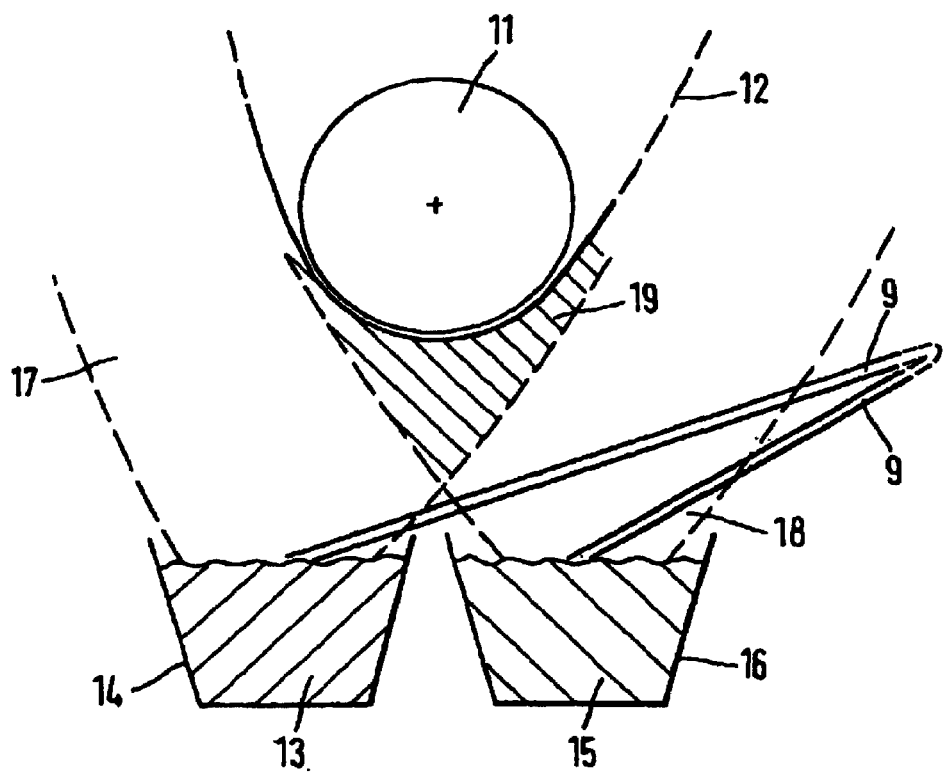

FIG. 3b shows a process management alternative to that shown in FIG. 3a. The evaporating material here is composed of two single components located in separate crucibles, namely Cu 13 in crucible 14 and Al 15 in crucible 16. The single components are molten and evaporated by means of electron beam 9, so that above the crucibles two vapor lobes 17, 18 are formed, which overlap each other in area 19. Due to this overlapping the vapor phase has a certain Cu/Al-composition. As described in FIG. 3a a film 12 guided on a chill roll 11 is placed in the vapor phase, so that an alloy of Cu and Al in the desired composition can be deposited.

DETAILED DESCRIPTION OF THE INVENTION

Since the components of the evaporating material in general are substances with different evaporation rates, which depend e.g. on the process temperature and the vapor pressures of the individual components, great demands have to be made on the method. So as to coat a substrate with a certain composition, the vapor phase has to contain the individual components in the desired quantity ratio. But it has to be taken into account that the quantity ratios, e.g. within a molten alloy, usually deviate from the quantity ratios within the vapor phase, which is due to the different vapor pressures of the components, and thus have to be appropriately adjusted. In the molten mass the proportion of components with a high vapor pressure usually has to be lower, whereas the concentration of components with a lower vapor pressure usually have to be present to a higher degree, so as to obtain the desired quantity ratio in the vapor phase. The composition of the molten mass is chosen in such a way, that at a certain temperature the desired composition, which is to be deposited on the substrate, is present in the vapor. Furthermore, the composition of the evaporating material will continuously change during the vapor deposition process due to the different evaporating rates of the individual components. This effect can be compensated either by feeding certain components of the evaporating material or by using large volumes of molten mass. Preferably, the volumes of molten mass are chosen in such large amounts that one coating cycle can be carried out without feeding any further evaporating material.

The vapor deposition of an alloy with a certain composition and a defined layer thickness preferably is controlled via a regulation mechanism, with the help of which the vapor-deposited layer is measured in transmitted light and/or reflected light, possibly at several points across the path width of the vapor-deposited substrate. For measuring the transmission and/or reflection optical devices known to persons skilled in the art are used.

With transmission measuring the optical density of the deposited layer is measured and thus indirectly the thickness of the layer. If the vapor-deposited layer thickness varies from the preset value, it can be influenced by changing the path speed with which the substrate to be vapor-deposited is moved, and/or by the evaporation rate of the substance to be vapor-deposited. The evaporation rate here can be controlled via the energy of the electron beam or the heating power. If the layer thickness for example is higher than desired, the amount of vapor-deposited substance per area unit can be decreased by increasing the path speed. Alternatively or additionally, the evaporation rate can also be reduced e.g. by lowering the heating power or by lowering the energy of the electron beam.

With reflection measuring the colour of the deposited layer is spectrally measured and with that the composition of a multicomponent evaporating material is indirectly determined. Usually for that purpose white light is irradiated, the reflected light spectrally analysed and described with the help of colour coordinates, e.g. according to the Munsell system or the CIE system. The colour coordinates of the vapor-deposited layer are compared to a desired value defined beforehand, which corresponds to a certain composition of the evaporating material, so that from a possible deviation a deviation in the composition can be concluded and, if so, countermeasures can be taken. The regulation here is effected via changing the evaporation rate of the individual components in the multicomponent evaporating material, e.g. by increasing or decreasing the electron beam energy or the heating power.

When carrying out the regulation mechanism the following variations are thinkable. In the following preferred embodiments are described, where two crucibles each contain one alloy component, the invention, however, not being restricted to these variations.

Variation A:

The heating power in crucible 1, which preferably contains the main component of the alloy, is firmly set. The heating power is measured in such a way, that the result is, as experience has shown, a metal deposition of regular thickness across the whole width of the film that usually amounts to one to two meters. The amount of the alloy main component contained in crucible 1 here is dimensioned in such a way, that changes in the total heating power (sum of heating power in crucible 1 and crucible 2) has no effect on the layer thickness of the deposited evaporating material. Measuring the transmission for determining the layer thickness is therefore not necessary. But while the film is coated, the colour coordinates of the vapor-deposited layer are measured in reflected light, possibly at several points across the path width, and compared to a desired value defined beforehand. The deviations of one or several coordinates are then used to regulate the heating power in crucible 2. If crucible 2 is of a trough-shaped design, beside the heating power in crucible 2 possibly also the lateral distribution of the heating power above the length of the trough can be regulated.

Variation B:

As in variation A the heating power in crucible 1, which preferably contains the main component of the alloy, is firmly set, so that, as experience has shown, a metal deposition of regular thickness across the width of the film is obtained. While the film is coated, the optical density of the vapor-deposited layer is measured in transmitted light, possibly at several points across the path width. If values have been determined at different points of the path width, the average value of the optical density is calculated and compared to a given desired value for the layer thickness. In case of deviations the path speed, with which the film to be coated is moved, is regulated accordingly. For regulating the heating power in crucible 2 the same method as in Variation A is used.

Variation C:

Here the evaporation rate in crucible 1 as well as in crucible 2 is regulated at a constant path speed, with which the substrate to be vapor-deposited is moved forward. The evaporation rates here again are controlled via the heating power or the energy of the electron beam. The regulation of the evaporation rates here is influenced via the transmission measuring of the optical density of the deposited layer as well as by means of reflection measuring for determining the colour coordinates. So as to produce a constant layer thickness and thus a constant total amount of deposited material, the total heating power in crucible 1 and 2 preferably is of a constant value. For producing a constant alloy composition the relation of the heating power in crucible 1 to that in crucible 2 is preferably adjusted in a constant manner.

The evaporating material preferably is a multicomponent system, such as compounds, mixtures or alloys, which produces a precious-metal coloured tone after being deposited onto the substrate. Within the terms of the invention, "precious-metal coloured" means every colour tone which contains silver- and/or gold-coloured portions. Consequently, depending on the composition of the evaporating material, the colour scale of the coating does not only contain the pure silver or gold tones. The color scale of silver tones ranges from a silver tone enriched with a white content to silver tones with light to dark grey or even black content. The colour scale of gold tones ranges from light gold, nickel, gold to dark gold and bronze. Additionally, by taking the respective measures also e.g. precious-metal coloured tones with tinges of yellow, green, red and brown can be produced.

Preferably, "precious-metal coloured" means gold-coloured, and gold-coloured here comprises any thinkable gold tone.

Preferably the evaporating material is an alloy, in particular gold bronze, "Gold bronze" within the terms of the invention means all the copper base alloys, in particular alloys which comprise copper and aluminum. Further preferred alloys are alloys comprising copper and tin, alloys comprising copper and silver or alloys comprising copper, tin and silver. Preferably the alloys deposited on the substrate comprise 95 to 75 weight per cent, particularly preferred 95 to 85 weight per cent, and in particular preferred 92 weight per cent copper. In an embodiment particularly preferred the alloy comprises 5 to 15 weight per cent aluminum and 95 to 85 weight per cent copper. The layer vapor-deposited onto the substrate preferably is composed of 8 weight per cent aluminum and 92 weight per cent copper, so that the result is a gold-coloured tone.

For producing further colour tones, such as e.g. precious-metal tones, in particular gold tones, with tinges of yellow, green, red and brown, there exists the possibility of adding portions of foreign metal to the alloys. Suitable foreign metals are e.g. iron, manganese, vanadium, chromium, nickel, cobalt, silicon, magnesium, zinc or titanium. Preferably the portions of foreign metals amount to 5 weight per cent referred to the evaporating material deposited onto the substrate. Of course there also exists the possibility of producing colour tones of a more silvery appearance e.g. by increasing the aluminum portion. The respective composition of the evaporating material for producing the desired colour tones on the substrate can be ascertained by a person skilled in the art by respective preliminary experiments.

The layer thickness of the vapor-deposited layer on the substrate preferably amounts to at least 20 nm up to a maximum of 200 nm, in particular layer thicknesses of 50 up to 150 nm are preferred. Of course layer thicknesses of less than 20 nm, for example layers of a thickness of a few μm can also be used.

The multicomponent coating produced according to the invention can be distinguished from those coatings that are produced by methods according to prior art, such as e.g. sputtering or vapor deposition with evaporation boat, by different crystalline structure parameters, such as particle size, refractive index and conductivity. The analysis here can be more or less elaborate depending on the parameter taken into account, but lies within the range of knowledge of a person skilled in the art.

The possibility of producing several gold-coloured tones also provides the option to equip a security element with several colour tones. The inventive security element, however, has at least one precious-metal-coloured coating. The optical impression rendered by such a security element can be imitated, if at all, only with great efforts, in particular if different-coloured coatings are applied in complicated patterns. The security element can be a security thread which consists of a self-supporting plastic film to which the precious-metal coloured coatings are applied. This security thread can at least partially be placed in a security paper or security document. But it is also thinkable to form the security element in a ribbon-shaped or label-shaped fashion and to fasten it to the surface of the security paper or document of value.

Alternatively, the security element can also have the form of a transfer element. This variation is particularly advantageous, if the security element is disposed completely on the surface of the security paper or document of value. In this case the layer structure of the security element is prepared on a carrier film, usually a plastic film, and then transferred in the desired outline contours to the security paper or document of value by means of a hot stamping method.

If the security element is disposed on the surface of the security paper or the document of value, it can have any outline structure, such as for example round, oval, star-shaped, rectangular, trapezoidal or strip-shaped outline contours. But the use of the inventive security element is not restricted to the sector of security documents. The inventive security element can also be advantageously used in the sector of product protection for protecting any goods from forgery. For that purpose the security element can have antitheft elements as well, such as for example a coil or a chip. The same applies to the security paper or document of value that is provided with such a security element.

The substrate to be vapor-deposited preferably is a plastic film, preferably made of PET (polyethylene terephthalate), POP (polyphenylene oxide), PEN (polyethylene naphthalate) or PC (polycarbonate).

Additionally, the plastic film of the security element can be provided with diffraction structures in the form of a relief structure. The diffraction structures can be any diffractive structures such as holograms or grating structures (e.g. Kinegram®, pixelgram) or the like. Usually these diffraction structures are embossed in the plastic film.

As a further optically striking feature also gaps can be worked into the inventive coating, preferably with the help of a washing method as described in WO 99/13157 to which explicit reference is made herein. Here the security elements are prepared as a security film, which has several advantages of the security element. The basic material is a self-supporting, preferably transparent plastic film. This plastic film in the case of security threads or labels corresponds to the inventive plastic layer of the security element. If the security elements are dissolved out from an embossed film, the plastic film forms the carrier material of this transfer material, to which the plastic layer is applied in the form of a lacquer layer. In this lacquer layer or, in case of security threads or labels, in this plastic film diffraction structures can be embossed. The inventive plastic layer of the security element is printed in the form of the future gaps, preferably by gravure printing. For this a printing ink with a high pigment content is used, which forms a pored and raised applied ink layer. Then the coating is vapor-deposited to the printed plastic layer. As a last stage finally the applied ink layer and the inventive coating on top of it are removed by washing out with a liquid, possibly combined with mechanical action. Preferably a water-soluble printing ink is used, so that water can be used as a liquid. With that this method is very environmentally friendly and does not require any particular protective measures.

The washing out can be supported by mechanical means, such as a rotating roll, brush or ultrasound.

The use of etching techniques is in a considerable manner more elaborate, but in principle also possible. Here at first the inventive coating is deposited onto the plastic layer and then the whole surface, except for the areas to be removed, is printed with a protective lacquer layer. The whole security element layer structure is then guided through an etching bath, in which the areas not covered are dissolved from the plastic layer. If for different coatings different etching bathes are necessary, the covering process or the process of dipping into the etching bath has to be repeated with diverse etching solutions. Between the different etching bathes neutralization and cleaning bathes have to be provided, so that the chemicals of the different bathes are not rendered impure.

Other methods are also thinkable, such as e.g. mechanical removal of the inventive coating or producing the breaches by means of laser scriber, electron beam erosion or other removal processes.

The substrates vapor-deposited according to the invention can be further processed by e.g. mechanically scraping the vapor-deposited layer from the substrate, so that fine small plates are produced. These small plates preferably can be worked into printing ink and as such be used for security elements.

The inventive coating method has the advantage that therewith in an extremely economic way, i.e. cost and time saving, precious-metal-coloured coatings can be produced, which compared to prior art are of an extremely regular design in view of colour tone and layer thickness.

Due to their optically striking coating the security elements and documents of value produced according to the invention have a forgery-proofness increased accordingly, since they are recognizable without any further auxiliary means.

Further embodiments and advantages of the inventive method, security element or security paper and document of value are explained with reference to the example and the figures.

Example 1

In a electron-beam vapor deposition plant films made of PET, alternatively made of POP, PC or PEN, of a width of 1000 mm are coated with a layer thickness of approximately 55 nm made of 8 weight per cent aluminum and 92 weight per cent copper. The evaporation is effected out of a crucible, the volumetric capacity of which is of at least such a large amount that one coating cycle can be carried out without feeding further material. The evaporating material, an aluminum/copper alloy, is heated with an electron gun. Since copper has a higher vapor pressure than aluminum in the molten mass, in the vapor the copper proportion is higher than compared to the molten mass. On a substrate moved through the vapor thus a copper-coloured film would be deposited. As to avoid this problem, the proportion of aluminum is increased relatively to that of copper in the molten mass. For that reason 80% copper and 20% aluminum are used in the molten mass, which has a silvery colour tone. But the vapor above the molten mass has a copper aluminum proportion, which leads to gold-coloured deposits on a substrate having the above-mentioned aluminum/copper proportion (8/92). During longer vapor deposition periods the mixture ratio changes in favour of aluminum due to the higher evaporating rate of copper. This effect can be compensated either by feeding further copper or by using large volumes of molten mass. When using large amounts of molten mass the mixture ratio during a coating cycle changes only slightly and the colour tone of the vapor-deposited layer remains regular.

Example 2

This embodiment corresponds to that described in example 1 and differs from example 1 in that the evaporating material is caused to melt and evaporate not by means of an electron beam, but by means of a resistance-heated crucible.

The invention claimed is:

1. Method for producing a security element or transfer element for securing documents of value or for protecting products, comprising:
   vapor depositing a substrate with a multicomponent evaporating material, which is transformed into the vapor phase by means of electron beam or resistance heating, such that the evaporized evaporating material deposits as a precious-metal-coloured coating on the substrate;
   measuring a color composition of the coating by reflection measurement;
   comparing the measured color composition to a desired color composition; and
   correcting deviations in the color composition of the coating, from the desired color composition, by adjusting at least one of a heating power and an energy of an electron beam.

2. Method according to claim 1, wherein the precious-metal-coloured coating is gold-coloured.

3. Method according to claim 1, wherein the evaporating material consists of individual components in separate crucibles.

4. Method according to claim 1, wherein the evaporating material is an alloy.

5. Method according to claim 1, wherein the evaporating material comprises one or several metals from the group containing copper (Cu), aluminum (Al), tin (Sn) and silver (Ag).

6. Method according to claim 1, wherein the evaporating material comprises Al/Cu or Sn/Cu or Ag/Cu or Ag/Sn/Cu.

7. Method according to claim 1, wherein the coating comprises 5 to 15 weight percent aluminum and 85 to 95 weight percent copper.

8. Method according to claim 1, wherein the evaporating material comprises at least one foreign metal.

9. Method according to claim 8, wherein the foreign metal is chosen from the group of iron, manganese, vanadium, chromium, cobalt, silicon, magnesium, zinc or titanium.

10. Method according to claim 1, wherein on the substrate are deposited different precious-metal-coloured coatings.

11. Method according to claim 1, wherein the substrate is a plastic film.

12. Method according to claim 1, wherein the coating is deposited in a layer thickness of 50 to 100 nm.

13. Method according to claim 1, wherein before the coating process diffraction structures are embossed into the substrate.

14. Method according to claim 1, wherein after the coating process the substrate is cut in a strip-shaped or ribbon-shaped fashion.

15. Method according to claim 1, wherein the coating is removed from the substrate and broken into small plates, which, optionally, can be processed into printing ink.

16. Security element or transfer element for securing documents of value or for protecting products, produced according to claim 1.

17. Security element or transfer element according to claim 16, wherein the coating deposited on the substrate is at least one coating made of a precious-metal-coloured alloy.

18. Security element or transfer element according to claim 17, wherein the alloy is gold-coloured.

19. Security element or transfer element according to claim 17, wherein the alloy comprises copper.

20. Security element or transfer element according to claim 17, wherein the alloy comprises at least one of aluminum, tin and silver.

21. Security element or transfer element according to claim 17, wherein the alloy comprises 8 weight percent aluminum and 92 weight percent copper.

22. Security element or transfer element according to claim 17, wherein the alloy comprises at least one foreign metal.

23. Security element or transfer element according to claim 22, wherein the foreign metal is chosen from the group of iron, manganese, vanadium, chromium, cobalt, silicon, magnesium, zinc or titanium.

24. Security element or transfer element according to claim 17, wherein the substrate is a plastic film.

25. Security element or transfer element according to claim 17, wherein the coating has a layer thickness of 50 to 100 nm.

26. Security element or transfer element according to claim 17, wherein the coating is at least partially overlaid with diffraction structures.

27. Security element or transfer element according to claim 26, wherein the diffraction structures are embossed in the substrate.

28. Security element according to claim 1, wherein the security element is a self-supporting label.

29. Security element according to claim 1, wherein the security element is a security thread.

30. Security paper for producing documents of value or document of value, characterized in that it has at least one security element according to claim 1.

31. Security paper or document of value according to claim 30, wherein the security element is a security thread and embedded at least partially in the security paper.

32. Security paper or document of value according to claim 30, wherein the security element is a transfer element, which is applied to the surface of the security paper.

33. A method for protecting goods from forgery comprising incorporating therewith a security element or transfer element according to claim 16.

34. A method for protecting goods from forgery comprising incorporating therewith a security paper or document of value according to claim 30.

35. Printing ink produced according to claim 15.

36. Method according to claim 1, further comprising determining a coating layer thickness by transmission measurement and correcting deviations in the coating layer thickness from a desired value by adjusting at least one of a heating power, an energy of an electron beam and a substrate path speed.

* * * * *

UNITED STATES PATENT AND TRADEMARK OFFICE
CERTIFICATE OF CORRECTION

| | | |
|---|---|---|
| PATENT NO. | : 7,648,763 B2 | Page 1 of 1 |
| APPLICATION NO. | : 10/509178 | |
| DATED | : January 19, 2010 | |
| INVENTOR(S) | : Heim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 434 days.

Signed and Sealed this
Twenty-ninth Day of March, 2011

David J. Kappos
*Director of the United States Patent and Trademark Office*